United States Patent
Nagai et al.

(10) Patent No.: US 12,080,935 B2
(45) Date of Patent: Sep. 3, 2024

(54) TRANSMISSION LINE AND CIRCUIT BOARD

(71) Applicant: Murata Manufacturing Co., Ltd., Nagaokakyo (JP)

(72) Inventors: Tomohiro Nagai, Nagaokakyo (JP); Nobuyuki Tenno, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 339 days.

(21) Appl. No.: 17/694,794

(22) Filed: Mar. 15, 2022

(65) Prior Publication Data

US 2022/0200118 A1 Jun. 23, 2022

Related U.S. Application Data

(63) Continuation of application No. PCT/JP2020/036831, filed on Sep. 29, 2020.

(30) Foreign Application Priority Data

Oct. 2, 2019 (JP) .................... 2019-181875

(51) Int. Cl.
*H01P 3/08* (2006.01)
*H01P 5/02* (2006.01)
(Continued)

(52) U.S. Cl.
CPC ............ *H01P 3/088* (2013.01); *H01P 3/081* (2013.01); *H01P 5/022* (2013.01); *H05K 1/0218* (2013.01); *H05K 1/18* (2013.01)

(58) Field of Classification Search
CPC .......... H01P 5/022; H01P 3/081; H01P 3/088; H01P 3/082; H01P 3/08
(Continued)

(56) References Cited

U.S. PATENT DOCUMENTS

2002/0084514 A1* 7/2002 Maetani ................ H01L 23/66
257/664
2010/0045537 A1 2/2010 Satomi
(Continued)

FOREIGN PATENT DOCUMENTS

JP 05-86859 A 4/1993
JP 2010-050627 A 3/2010
(Continued)

OTHER PUBLICATIONS

Official Communication issued in International Patent Application No. PCT/JP2020/036831, mailed on Dec. 8, 2020.

*Primary Examiner* — Rakesh B Patel
(74) *Attorney, Agent, or Firm* — Keating & Bennett, LLP

(57) ABSTRACT

A transmission line includes a first interlayer connection conductor connecting a first signal conductor and a first mounting electrode, a second interlayer connection conductor connecting a second signal conductor and a second mounting electrode, a third and fourth interlayer connection conductors respectively including third and fourth interlayer connection conductors, and each connecting first and second ground conductors between the first and second signal conductors. The third interlayer connection conductor is closer to the first and second interlayer connection conductors than the fourth interlayer connection conductor is, an adjacent distance between two of the fourth interlayer connection conductors is greater than an adjacent distance between two of the third interlayer connection conductors, and the adjacent distance between the two fourth interlayer connection conductors is less than about ½ of a minimum wavelength of signals transmitted by the first signal conductor and the second signal conductor.

20 Claims, 10 Drawing Sheets

(51) Int. Cl.
*H05K 1/02* (2006.01)
*H05K 1/18* (2006.01)

(58) Field of Classification Search
USPC .......................................... 333/236, 238, 245
See application file for complete search history.

(56) References Cited

U.S. PATENT DOCUMENTS

2017/0149111 A1    5/2017   Yosui et al.
2019/0088388 A1    3/2019   Baba et al.

FOREIGN PATENT DOCUMENTS

| | | |
|---|---|---|
| JP | 2013-026601 A | 2/2013 |
| WO | 2016/163436 A1 | 10/2016 |
| WO | 2017/199930 A1 | 11/2017 |

\* cited by examiner

TRANSMISSION LINE AND CIRCUIT BOARD

CROSS REFERENCE TO RELATED APPLICATIONS

This application claims the benefit of priority to Japanese Patent Application No. 2019-181875 filed on Oct. 2, 2019 and is a Continuation Application of PCT Application No. PCT/JP2020/036831 filed on Sep. 29, 2020. The entire contents of each application are hereby incorporated herein by reference.

BACKGROUND OF THE INVENTION

1. Field of the Invention

The present invention relates to a transmission line in or on a substrate and to a circuit board at which an electronic component is connected to the transmission line.

2. Description of the Related Art

Japanese Patent Application Publication No. 5-86859 discloses a wiring substrate for a high-speed logic element in which wiring lines are provided in parallel or radially at predetermined intervals and in which interlayer connection conductors are formed between the wiring lines at equal intervals shorter than a wavelength of a transmission signal.

When one end of a signal conductor formed in a substrate is connected to an electronic component mounting terminal on a surface of the substrate via an interlayer connection conductor, an electromagnetic field is disturbed around the interlayer connection conductor. This leads to the following problems.

(a) A mismatch is likely to occur between the impedance of a transmission line at an end portion of the signal conductor at which the interlayer connection conductor is formed and the impedance of the transmission line at a main portion of the signal conductor.

(b) A signal transmission loss occurs due to the impedance mismatch. Further, the transmission loss also occurs due to radiation to the surroundings due to the disturbance of the electromagnetic field.

(c) Although the disturbance of the electromagnetic field can be suppressed when an interlayer connection conductor for connecting upper and lower ground conductors sandwiching the signal conductor in a lamination direction is provided, many interlayer connection conductors are provided as a whole, which increases man-hours.

(d) When the transmission line is bent in a state where a connection portion of the transmission line is connected to a circuit board, the presence of the interlayer connection conductor hinders bendability thereof.

SUMMARY OF THE INVENTION

Preferred embodiments of the present invention provide transmission lines each having bendability, and circuit boards each including such transmission lines in which, when a structure is provided in which an end portion of a signal conductor is connected to an electronic component mounting terminal on a surface of a substrate via an interlayer connection conductor, a mismatch between impedance of a transmission line at an end portion of the signal conductor and impedance of the transmission line at a main portion of the signal conductor is reduced or prevented, radiation of an electromagnetic field to the surroundings is reduced or prevented, and the number of necessary interlayer connection conductors is reduced.

A transmission line according to a preferred embodiment of the present invention includes a substrate, a first signal conductor and a second signal conductor in the substrate and extending parallel or substantially parallel to each other, a first ground conductor and a second ground conductor in or on the substrate and sandwiching the first signal conductor and the second signal conductor in a lamination direction, a first mounting electrode and a second mounting electrode on the substrate, and a first interlayer connection conductor, a second interlayer connection conductor, a third interlayer connection conductor, and a fourth interlayer connection conductor in the substrate. The first interlayer connection conductor connects the first signal conductor and the first mounting electrode, the second interlayer connection conductor connects the second signal conductor and the second mounting electrode, the third interlayer connection conductor and the fourth interlayer connection conductor respectively include a plurality of third interlayer connection conductors and a plurality of fourth interlayer connection conductors, and each connect the first ground conductor and the second ground conductor between the first signal conductor and the second signal conductor. Further, two of the plurality of third interlayer connection conductors are closer to the first interlayer connection conductor and the second interlayer connection conductor than two of the plurality of fourth interlayer connection conductors are, an adjacent distance between the two of the plurality of fourth interlayer connection conductors is greater than an adjacent distance between the two of the plurality of third interlayer connection conductors, and the adjacent distance between the two of the plurality of fourth interlayer connection conductors is less than about ½ of a minimum wavelength of signals transmitted by the first signal conductor and the second signal conductor.

A circuit board according to a preferred embodiment of the present invention includes a transmission line according to a preferred embodiment of the present invention and an electronic component. The electronic component is a multipolar connector including a first signal terminal electrically connected to the first mounting electrode and a second signal terminal electrically connected to the second mounting electrode.

According to preferred embodiments of the present invention, transmission lines in each of which bendability of a bent portion is ensured, and circuit boards each including a transmission line according to a preferred embodiment of the present invention are obtained in which, when a structure in which an end portion of a signal conductor is connected to an electronic component mounting terminal on a surface of a substrate via an interlayer connection conductor is provided, an impedance mismatch of a transmission line at an end portion of the signal conductor is reduced or prevented and in which the number of necessary interlayer connection conductors is reduced.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
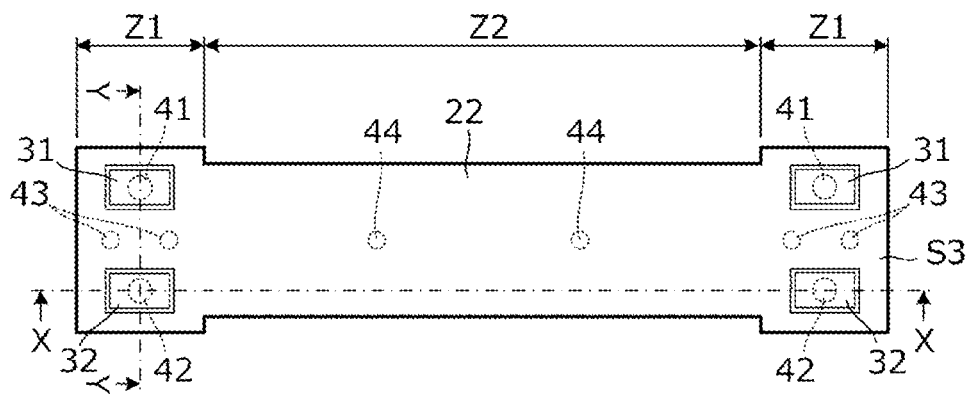
FIG. 1 is an exploded plan view of a transmission line 101 according to a first preferred embodiment of the present invention including four base layers of a substrate which is a component of the transmission line.
Figure 1:
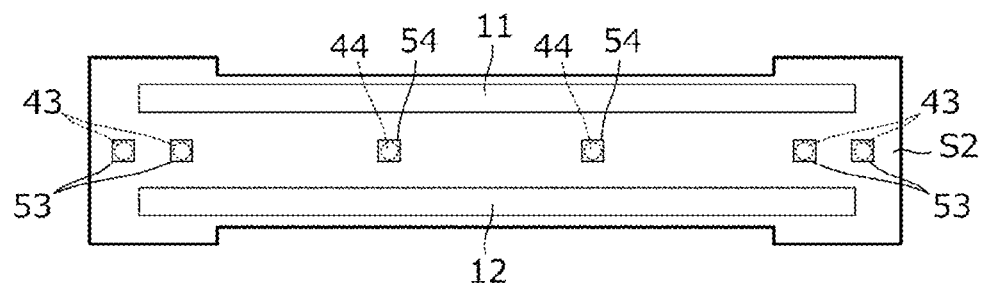
Figure 1:
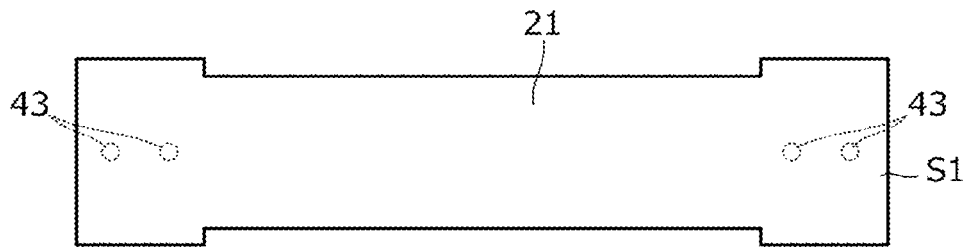
Figure 1:
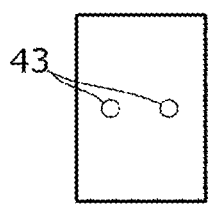
Figure 1:
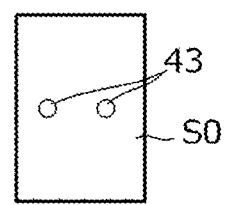

Hereinafter, preferred embodiments of the present invention will be described with reference to the accompanying drawings. In each of the drawings, the same or corresponding portions and elements are denoted by the same reference numerals. In consideration of a description of main points or ease of understanding, several preferred embodiments are individually described for convenience of description. However, partial replacement or combination of configurations to be described in different preferred embodiments is possible. In second and subsequent preferred embodiments, descriptions of matters common to a first preferred embodiment will be omitted, and only different points will be described. In particular, the same or similar advantageous effects due to the same or similar configurations will not be sequentially described for each preferred embodiment.

First Preferred Embodiment

Figure 2A:
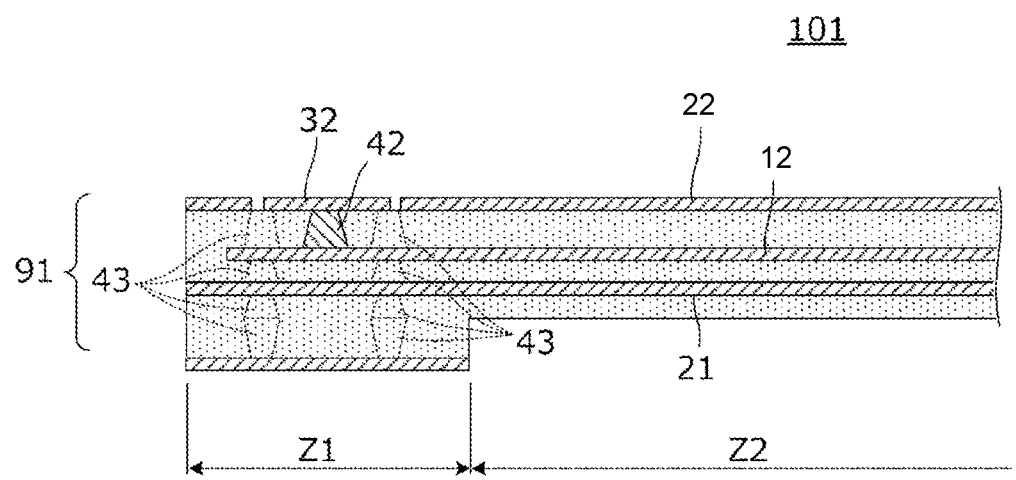
FIGS. 2A and 2B are sectional views of the transmission line 101 according to the first preferred embodiment of the present invention.
Figure 2B:
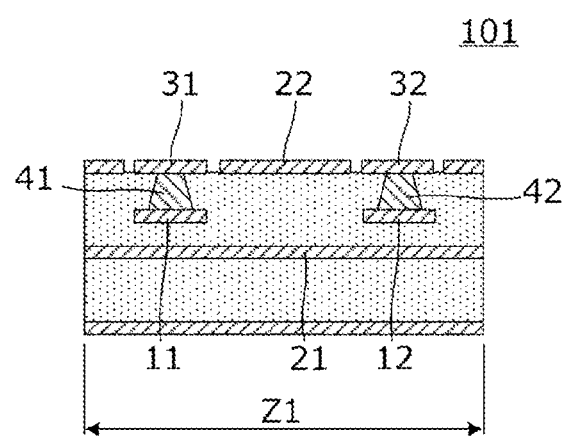

FIG. 1 is an exploded plan view of a transmission line according to a first preferred embodiment of the present invention including four base layers of a substrate which is a component of the transmission line. FIGS. 2A and 2B are sectional views of a transmission line 101 according to the first preferred embodiment. FIG. 2A is a sectional view taken along line X-X in a state where the three base layers illustrated in FIG. 1 are laminated, and FIG. 2B is a sectional view taken along line Y-Y in a state where the three base layers illustrated in FIG. 1 are laminated.

The transmission line 101 is provided in or on a substrate 91. The substrate 91 has flexibility. The substrate 91 is a laminated body including four base layers S0, S1, S2, and S3 illustrated in FIG. 1. A ground conductor is provided on an entire or substantially an entire lower surface of the base layer S0. A first ground conductor 21 is provided on an entire or substantially an entire upper surface of the base layer S1. A first signal conductor 11 and a second signal conductor 12 extending parallel or substantially parallel to each other, and pad electrodes 53 and 54, are provided on an upper surface of the base layer S2. A second ground conductor 22, two first mounting electrodes 31, and two second mounting electrodes 32 are provided on an upper surface of the base layer S3. The second ground conductor 22 and the first mounting electrode 31 are insulated from each other, and the second ground conductor 22 and the second mounting electrode 32 are insulated from each other.

Before lamination and pressure bonding, the base layers S0, S1, S2, and S3 are, for example, thermoplastic insulating resin sheets. Each of the electrodes and the conductors is, for example, a copper foil pattern provided on the insulating resin sheet. The resin sheets each including the conductor pattern are stacked, heated, and pressed to provide a mother substrate made of resin, and the mother substrate made of resin is divided to provide many substrates. The base layers S0, S1, S2, and S3 may be, for example, thermoplastic resin layers including a liquid crystal polymer, PTFE, PFA, or the like. With such a thermoplastic resin layer, bendability of the base layers S0, S1, S2, and S3 can be improved.

The base layer S3 includes an interlayer connection conductor 41 that connects an end portion of the first signal conductor 11 and the first mounting electrode 31. Similarly, an interlayer connection conductor 42 that connects an end portion of the second signal conductor 12 and the second mounting electrode 32 is provided. Further, the base layer S3 includes interlayer connection conductors 43 and 44 that connect the second ground conductor 22 and the pad electrodes 53 and 54, respectively.

The base layer S2 includes the pad electrodes 53 and 54 electrically connected to the interlayer connection conductors 43 and 44, respectively, of the base layer S3. Further, the base layer S2 includes the interlayer connection conductors 43 and 44 that connect the first ground conductor 21 and the pad electrodes 53 and 54, respectively.

The base layer S1 includes the third interlayer connection conductor 43 electrically connected to the first ground conductor 21.

The base layer S0 includes the third interlayer connection conductor 43 that connects the ground conductor on the lower surface and the third interlayer connection conductor 43 of the base layer S1.

By laminating the base layers S0, S1, S2, and S3 to form the substrate 91, both ends of the first signal conductor 11 are connected to the respective first mounting electrodes 31 via first interlayer connection conductors 41, and both ends of the second signal conductors 12 are connected to the respective second mounting electrode 32 via second interlayer connection conductors 42. Further, the first ground conductor 21 and the second ground conductor 22 are connected to each other via the third interlayer connection conductors 43, the fourth interlayer connection conductors 44, and the pad electrodes 53 and 54.

Two of the plurality of third interlayer connection conductors 43 (in the example illustrated in FIG. 1, only two of the third interlayer connection conductors 43 are present in a first region Z1 described later, thus the number is two) are closer to the first interlayer connection conductor 41 and the second interlayer connection conductor 42 than two of the plurality of fourth interlayer connection conductors 44 (in the example illustrated in FIG. 1, only two of the fourth interlayer connection conductors 44 are present in a second region Z2 described later, thus the number is two) are. Further, an adjacent distance between the two fourth interlayer connection conductors 44 is greater than an adjacent distance between the two third interlayer connection conductors 43.

The adjacent distance between the third interlayer connection conductors 43 is, for example, less than about ½ the minimum wavelength of signals transmitted by the first signal conductor 11 and the second signal conductor 12. For example, when a signal frequency is about 39 GHz and the relative dielectric constant of the base layers S1, S2, and S3 is about 3.0, the wavelength is about 4.4 mm, and the adjacent distance between the third interlayer connection conductors 43 is less than about 2.2 mm. More preferably, for example, the adjacent distance between the third interlayer connection conductors 43 is less than about 1.1 mm, which is about ¼ the minimum wavelength of the signal transmitted. Further preferably, for example, the adjacent distance between the third interlayer connection conductors 43 is less than about 0.4 mm, which is about ¹⁄₁₀ the minimum wavelength of the signal transmitted.

In a portion where the end portion of the first signal conductor 11 and the first mounting electrode 31 are connected to each other in a lamination direction (Z-axis direction) via the first interlayer connection conductor 41, the first interlayer connection conductor 41 is separated from the first ground conductor 21 and the second ground conductor 22. Thus, when the third interlayer connection conductor 43 is not present, a disturbance of an electromagnetic field occurs near the first mounting electrode 31 and the second mounting electrode 32, but the third interlayer connection conductor 43 provides a ground potential portion near the first mounting electrode 31 and the second mounting electrode 32, and thus the disturbance of the electromagnetic field near the first mounting electrode 31 and the second mounting electrode 32 is reduced or prevented.

The substrate 91 includes the first region Z1 in which the first mounting electrode 31 and the second mounting electrode 32 are provided and the second region Z2, which is another region. The first interlayer connection conductor 41, the second interlayer connection conductor 42, and the third interlayer connection conductors 43 are provided in the first region Z1. The fourth interlayer connection conductors 44 are provided in the second region Z2. The thickness of the second region Z2 (second thickness) is less than the thickness of the first region Z1 (first thickness). Thus, bendability of the second region Z2 can be increased, while flatness of a mounting portion is ensured.

In the present preferred embodiment, the adjacent distance between the third interlayer connection conductors 43 is, for example, less than about ¼ the minimum wavelength of the signal. Thus, an electromagnetic field with a signal frequency hardly leaks from a gap between the third interlayer connection conductors 43 adjacent to each other, and isolation between the first interlayer connection conductor 41 and the second interlayer connection conductor 42 is sufficiently ensured.

In addition, in the present preferred embodiment, a diameter of the first interlayer connection conductor 41 is larger than a diameter of the third interlayer connection conductor 43. Accordingly, the third interlayer connection conductors 43 can be better arranged in a limited space between the first interlayer connection conductor 41 and the second interlayer connection conductor 42, and the advantageous effect of arranging the plurality of third interlayer connection conductors 43 is improved. In addition, by making the respective diameters of the first interlayer connection conductor 41 and the second interlayer connection conductor 42 relatively large, conductor loss thereof can be reduced, and thus an insertion loss of the transmission line can be reduced. Further, the inductance value can be reduced, and an impedance mismatch can be reduced or prevented.

Figure 3A:
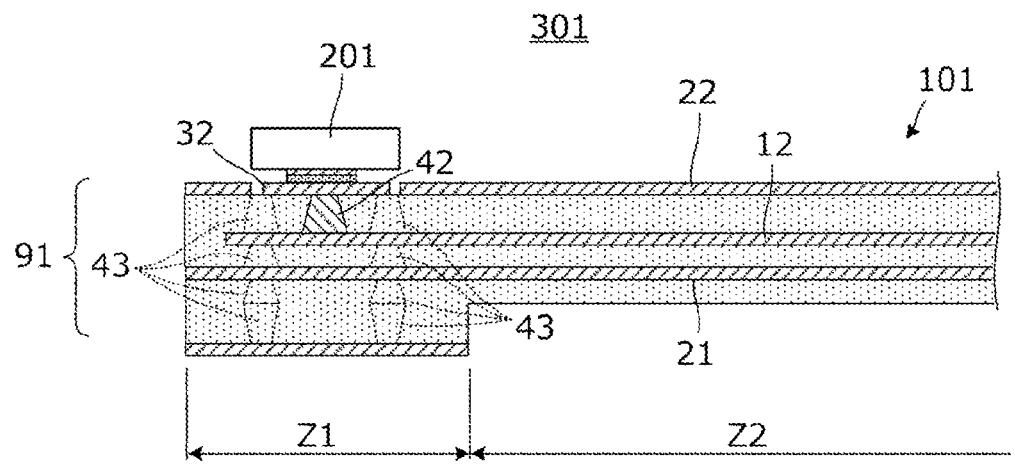
FIGS. 3A and 3B are sectional views of a circuit board 301 according to a preferred embodiment of the present invention including the transmission line 101 and an electronic component 201.
Figure 3B:
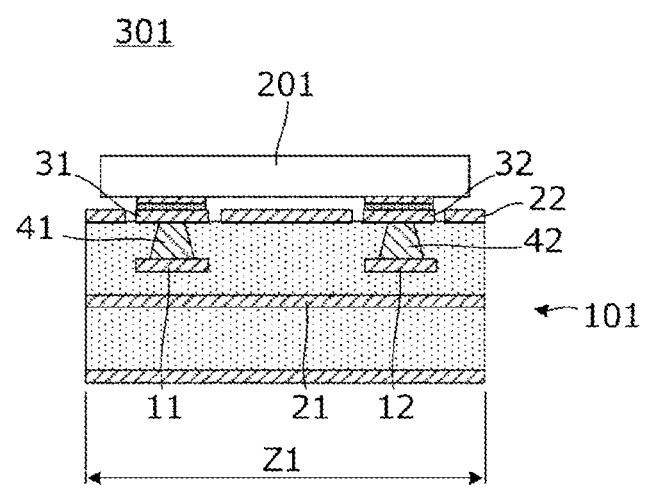

FIGS. 3A and 3B are sectional views of a circuit board 301 including the transmission line 101 and the electronic component 201. A sectional position of the sectional view illustrated in FIG. 3A corresponds to a sectional position illustrated in FIG. 2A, and a sectional position of the sectional view illustrated in FIG. 3B corresponds to a sectional position illustrated in FIG. 2B.

The electronic component 201 is a surface-mounted component having two terminals on a bottom surface and is soldered to the first mounting electrode 31 and the second mounting electrode 32 of the transmission line 101.

In the present preferred embodiment, the third interlayer connection conductor 43 is in a region overlapping an outer shape of the electronic component 201 to be mounted on the substrate 91 via the first mounting electrode 31 and the second mounting electrode 32. As described above, a formation region for the third interlayer connection conductor 43 can be defined by the region overlapping the electronic component.

Although one end of the transmission line 101 is illustrated in FIGS. 3A and 3B, the other end is connected to the circuit board. Alternatively, another electronic component may be mounted on the other end.

According to the first preferred embodiment, the following advantageous effects are achieved.

(a) Since the third interlayer connection conductors 43 are near the first interlayer connection conductor 41 that connects the end portion of the first signal conductor 11 and the first mounting electrode 31 and near the second interlayer connection conductor 42 that connects the end portion of the second signal conductor 12 and the second mounting electrode 32, an impedance of the transmission line at the end portion of the signal conductor can be approximated to an impedance of the transmission line at portions other than the end portion of the signal conductor, thus reducing or preventing an impedance mismatch of the transmission line at the end portion of the signal conductor.

(b) A transmission loss of a signal is reduced by the reduction or prevention of the impedance mismatch.

(c) Since a disturbance of an electromagnetic field near the first mounting electrode 31 and the second mounting electrode is effectively reduced or prevented by the third interlayer connection conductor 43, and since the fourth interlayer connection conductors 44 with a relatively large adjacent distance are provided in another region, a small number of the interlayer connection conductors are provided as a whole, and thus man-hours can be reduced.

(d) Since the adjacent distance between the fourth interlayer connection conductors 44 is greater than the adjacent distance between the third interlayer connection conductors 43, when the transmission line is bent in a portion other than a region where the first mounting electrode 31 and the second mounting electrode 32 are provided, bendability due to the presence of the fourth interlayer connection conductors 44 is not significantly hindered.

Second Preferred Embodiment

In a second preferred embodiment of the present invention, a transmission line, which is different from the transmission line described in the first preferred embodiment in a configuration of the second ground conductor 22, and a circuit board will be described.

Figure 4:
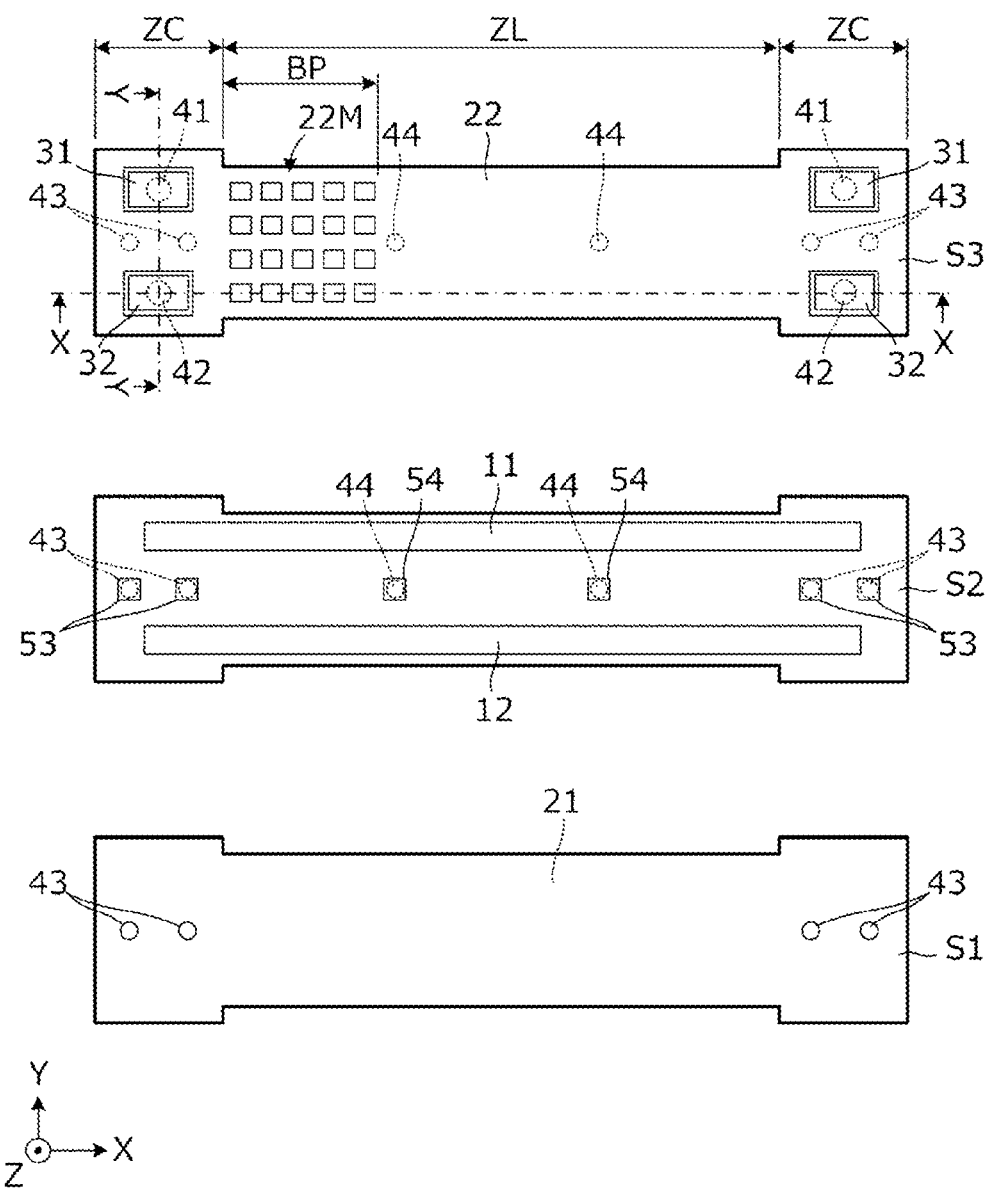
FIG. 4 is an exploded plan view of a transmission line 102 according to a second preferred embodiment of the present invention including three base layers of a substrate which is a component of the transmission line.

FIG. 4 is an exploded plan view of a transmission line 102 according to the second preferred embodiment including three base layers of a substrate which is a component of the transmission line. In the first preferred embodiment, the first region Z1 and the second region Z2 are defined according to a difference in thickness of the substrate, but in the second preferred embodiment, regions are defined with a connection region to a mounting substrate and another transmission line region. A region ZC illustrated in FIG. 4 is a mounting substrate connection region, and a region ZL is a transmission line region. A bent portion BP is provided in the transmission line region ZL.

A transmission line of the second preferred embodiment is different from the transmission line of the first preferred embodiment in a configuration of the second ground conductor 22. The second ground conductor 22 includes a mesh-shaped portion 22M in the bent portion BP of the transmission line. The mesh-shaped portion 22M is a portion in which openings, in which a ground conductor is not provided, are provided longitudinally and laterally in a mesh shape. For this reason, the mesh-shaped portion 22M has an area of ground conductor per unit area smaller than that of other portions.

Figure 5:
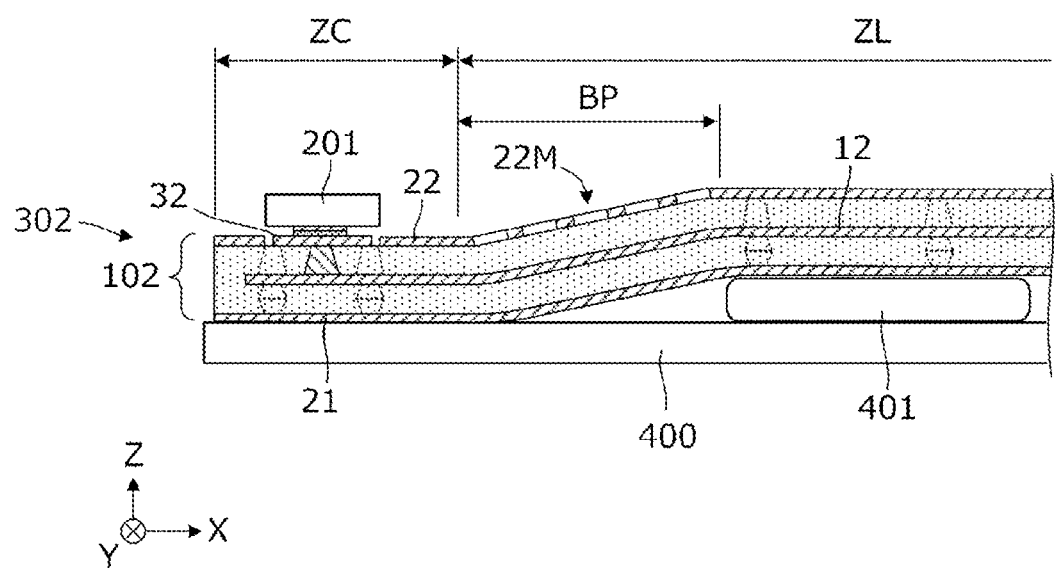
FIG. 5 is a sectional view in a state where the transmission line 102 according to the second preferred embodiment of the present invention is mounted on a mounting substrate.

FIG. 5 is a sectional view in a state where the transmission line 102 according to the second preferred embodiment is mounted on a mounting substrate. In FIG. 5, a mounting substrate 400 is, for example, a substrate included in a portable electronic device. A battery 401 is provided on the mounting substrate 400. The electronic component 201 is mounted in the mounting substrate connection region ZC of the transmission line 102.

A circuit board 302 is provided on and along the mounting substrate 400 with the battery 401 therebetween. In the mounting substrate connection region ZC of the transmission line 102, the first ground conductor 21 on a lower surface of the transmission line 102 is connected to a ground conductor provided on an upper surface of the mounting substrate 400.

In FIG. 4 and FIG. 5, an example is illustrated in which the mesh-shaped portion 22M is provided in the second ground conductor 22, but in the bent portion BP, a mesh-shaped portion may be provided in the first ground conductor 21, or the first ground conductor 21 and the second ground conductor 22 may both include a mesh-shaped portion.

In FIG. 5, although the mounting substrate connection region ZC at a left end of the transmission line 102 and a portion of the transmission line region ZL are illustrated, a configuration on a right end side of the transmission line 102 is the same as or similar thereto. Alternatively, the right end side of the transmission line 102 may be connected to a connection electrode provided on the mounting substrate 400, or another substrate or device.

The electronic component 201 may be first mounted on the transmission line 102 to form the circuit board 302 and then the circuit board 302 may be mounted on the mounting substrate 400, or the transmission line 102 may be mounted on the mounting substrate 400 and then the electronic component 201 may be mounted on the transmission line 102.

In the example illustrated in FIG. 5, the thickness of the transmission line 102 is the same or substantially the same in both the mounting substrate connection region ZC and the transmission line region ZL, but since the mesh-shaped portion 22M has an area of ground conductor per unit area smaller than that of other portions, bendability of the bent portion BP is higher.

As described above, in the second preferred embodiment, since the second ground conductor 22 includes the mesh-shaped portion 22M in the bent portion BP of the transmission line 102, bendability of the bent portion BP is improved.

Third Preferred Embodiment

In a third preferred embodiment of the present invention, a transmission line will be described which is different from the transmission line described in the first preferred embodiment in a configuration of the third interlayer connection conductors 43.

Figure 6:
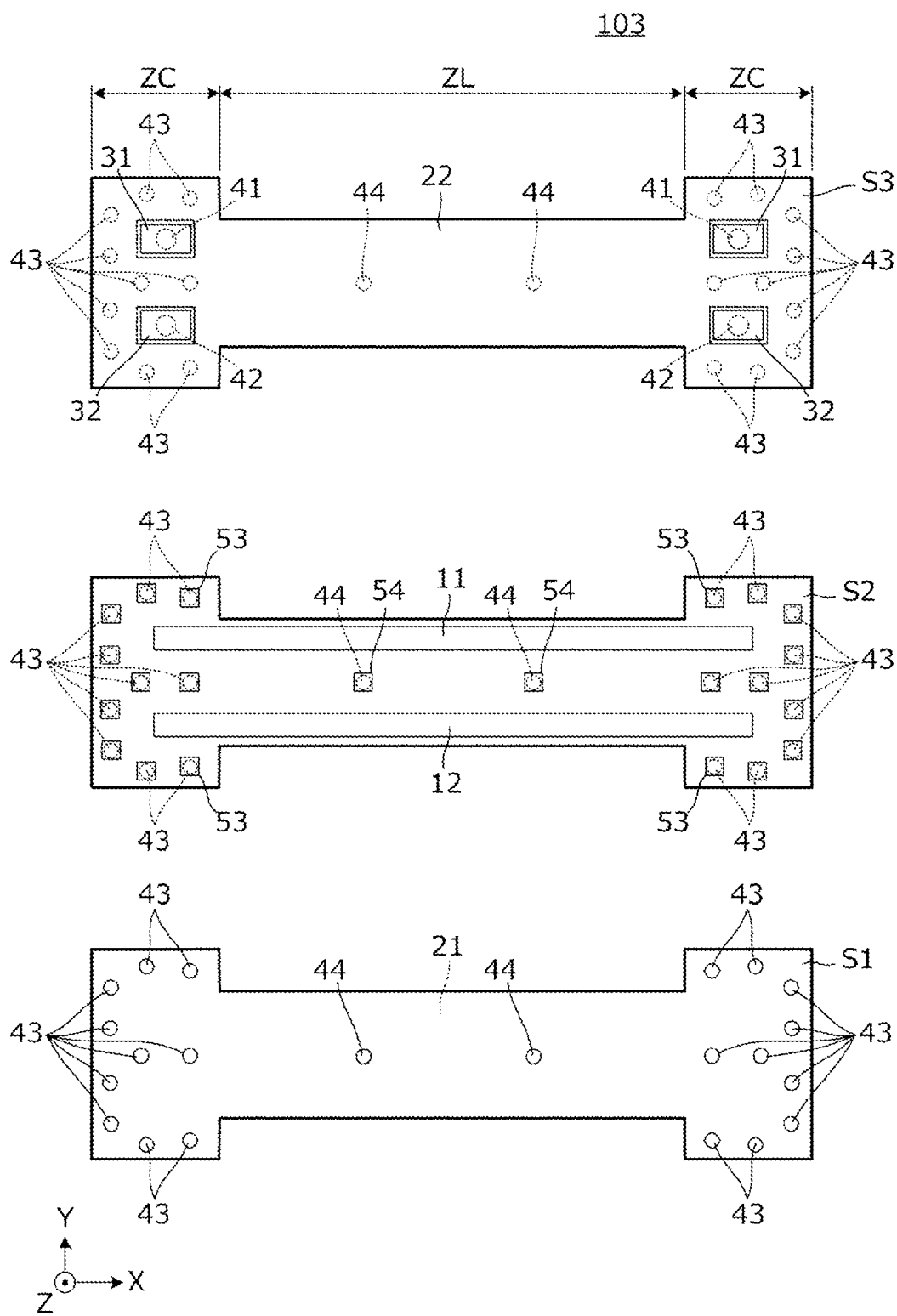
FIG. 6 is an exploded plan view of a transmission line 103 according to a third preferred embodiment of the present invention including three base layers of a substrate which is a component of the transmission line.

FIG. 6 is an exploded plan view of a transmission line 103 according to the third preferred embodiment including three base layers of a substrate which is a component of the transmission line.

The transmission line according to the third preferred embodiment is provided in or on a substrate, similarly to the transmission line described in the first preferred embodiment. The substrate is a laminated body including the three base layers S1, S2, and S3 illustrated in FIG. 6. The first ground conductor is provided on an entire or substantially an entire lower surface of the base layer S1. The first signal conductor 11 and the second signal conductor 12 extending parallel or substantially parallel to each other, and the pad electrodes 53 and 54 are provided on an upper surface of the base layer S2. The second ground conductor 22, the two first mounting electrodes 31, and the two second mounting electrodes 32 are provided on an upper surface of the base layer S3. The second ground conductor 22 and the first mounting electrode 31 are insulated from each other, and the second ground conductor 22 and the second mounting electrode 32 are insulated from each other.

The base layer S3 includes the first interlayer connection conductor 41 that connects an end portion of the first signal conductor 11 and the first mounting electrode 31. Similarly, the second interlayer connection conductor 42 that connects an end portion of the second signal conductor 12 and the second mounting electrode 32 is provided. Further, the base layer S3 includes the third interlayer connection conductor 43 connected to the second ground conductor 22 and the pad electrode 53 described below and the fourth interlayer connection conductor 44 connected to the pad electrode 54 described below.

The base layer S2 includes the pad electrode 53 electrically connected to the third interlayer connection conductor 43 of the base layer S3 and the pad electrode 54 electrically connected to the fourth interlayer connection conductor 44 of the base layer S3. In addition, the base layer S2 includes the third interlayer connection conductor 43 connected to the third interlayer connection conductor 43 of the base layer S1 and the pad electrode 53, and the fourth interlayer connection conductor 44 connected to the fourth interlayer connection conductor 44 of the base layer S1 and the pad electrode 54.

The base layer S1 includes the third interlayer connection conductor 43 and the fourth interlayer connection conductor 44 that are electrically connected to the first ground conductor 21 on the lower surface.

As is clear from a comparison with the example illustrated in FIG. 1, the plurality of third interlayer connection conductors 43 surround the first interlayer connection conductor 41 and the second interlayer connection conductor 42 in plan view of the substrate.

According to the third preferred embodiment, the plurality of third interlayer connection conductors 43 surround a circumference of the first interlayer connection conductor 41, and thus a pseudo coaxial line is defined by the third interlayer connection conductors 43 and the first interlayer connection conductor 41. Similarly, the plurality of third interlayer connection conductors 43 surround a circumference of the second interlayer connection conductor 42, and thus a pseudo coaxial line is defined by the third interlayer connection conductors 43 and the second interlayer connection conductor 42. An impedance of these coaxial lines can be approximated to a characteristic impedance of a strip line defined by the signal conductors 11 and 12, the first ground conductor 21, and the second ground conductor 22. That is, an impedance mismatch near the first interlayer connection conductor 41 and the second interlayer connection conductor 42 can be further reduced or prevented, compared with a case where the number of third interlayer connection conductors 43 is small or a case where there is no third interlayer connection conductor 43.

Fourth Preferred Embodiment

In a fourth preferred embodiment of the present invention, an example will be described in which the third interlayer connection conductor 43 is defined by a mounting region for an electronic component.

Figure 7:
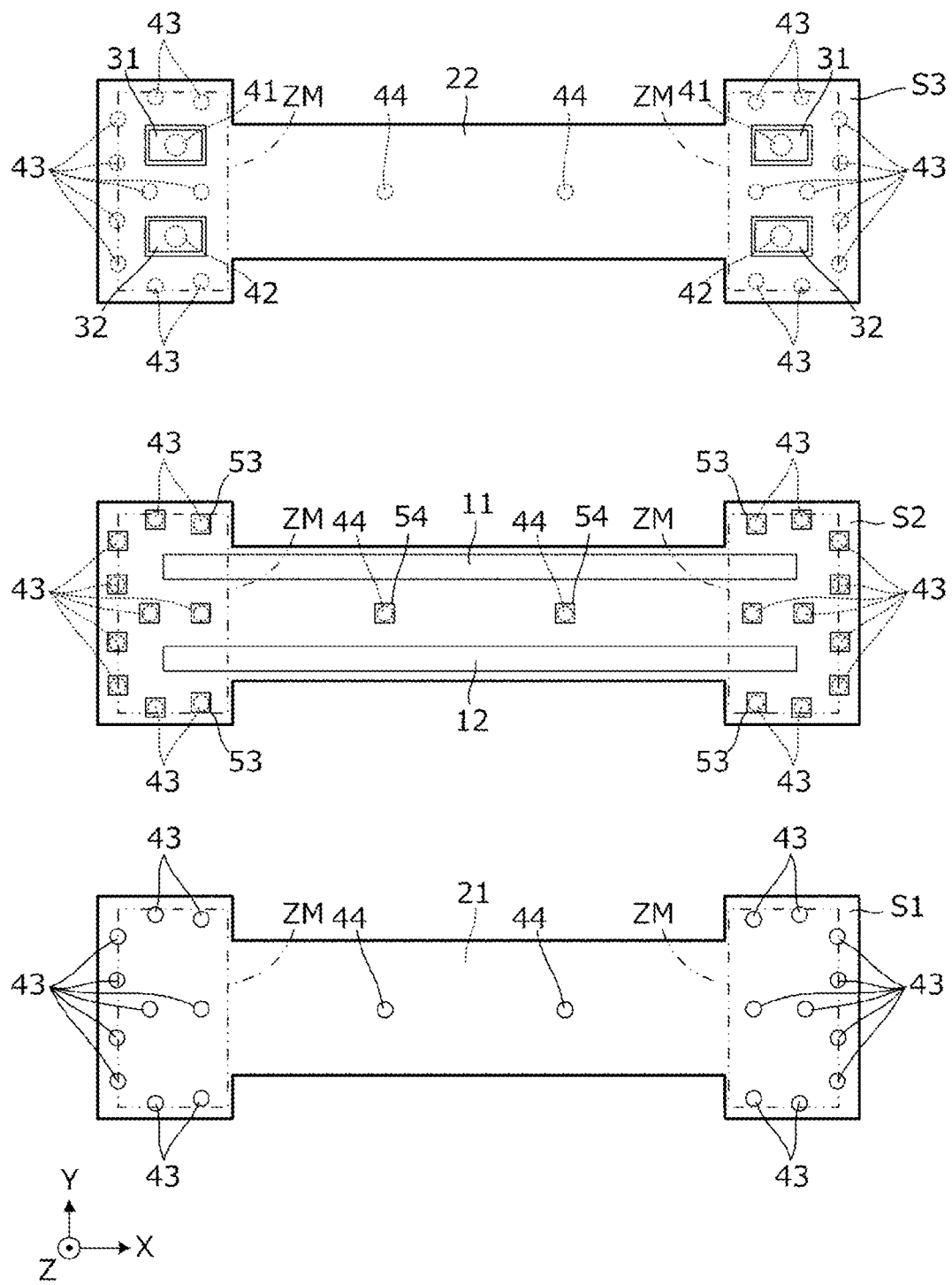
FIG. 7 is an exploded plan view of a transmission line 104 according to a fourth preferred embodiment of the present invention including three base layers of a substrate which is a component of the transmission line.

FIG. 7 is an exploded plan view of the transmission line 104 according to the fourth preferred embodiment including three base layers of a substrate which is a component of the transmission line.

The transmission line according to the fourth preferred embodiment is a laminated body including three base layers S1, S2, and S3, similar to the transmission line described in the third preferred embodiment. The first ground conductor 21 is provided on an entire or substantially an entire lower surface of the base layer S1. The first signal conductor 11 and the second signal conductor 12 extending parallel or substantially parallel to each other and the pad electrodes 53 and 54 are provided on an upper surface of the base layer S2. The second ground conductor 22, the two first mounting electrodes 31, and the two second mounting electrodes 32 are provided on an upper surface of the base layer S3. The second ground conductor 22 and the first mounting electrode 31 are insulated from each other, and the second ground conductor 22 and the second mounting electrode 32 are insulated from each other.

The base layer S3 includes the interlayer connection conductor 41 that connects an end portion of the first signal conductor 11 and the first mounting electrode 31. Similarly, the interlayer connection conductor 42 that connects an end portion of the second signal conductor 12 and the second mounting electrode 32 is provided. Further, the base layer S3 includes the interlayer connection conductors 43 and 44 that connect the second ground conductor 22 and the pad electrodes 53 and 54, respectively, described below.

The base layer S2 includes the pad electrodes 53 and 54 electrically connected to the interlayer connection conductors 43 and 44, respectively, of the base layer S3. Further, the base layer S2 includes the interlayer connection conductors 43 and 44 that connect the interlayer connection conductors 43 and 44 of the base layer S1 and the pad electrodes 53 and 54, respectively.

The base layer S1 includes the interlayer connection conductors 43 and 44 electrically connected to the first ground conductor 21 on a lower surface.

In the third preferred embodiment, an example has been described in which the first interlayer connection conductor 41, the second interlayer connection conductor 42, and the third interlayer connection conductors 43 are provided in the mounting substrate connection region ZC illustrated in FIG. 6, but in the fourth preferred embodiment, the substrate includes a mounting region ZM for an electronic component to be mounted via the first mounting electrode 31 and the second mounting electrode 32. The mounting region ZM is a region overlapping an outer shape of the electronic component to be mounted on the substrate. The first interlayer connection conductor 41, the second interlayer connection conductor 42, and the third interlayer connection conductors 43 are located in the mounting region ZM. Further, the fourth interlayer connection conductors 44 are located in a region other than the mounting region ZM.

Fifth Preferred Embodiment

In a fifth preferred embodiment of the present invention, a transmission line will be described which is different from the transmission line described in the first preferred embodiment in a configuration of the first ground conductor 21 and the second ground conductor 22.

Figure 8:
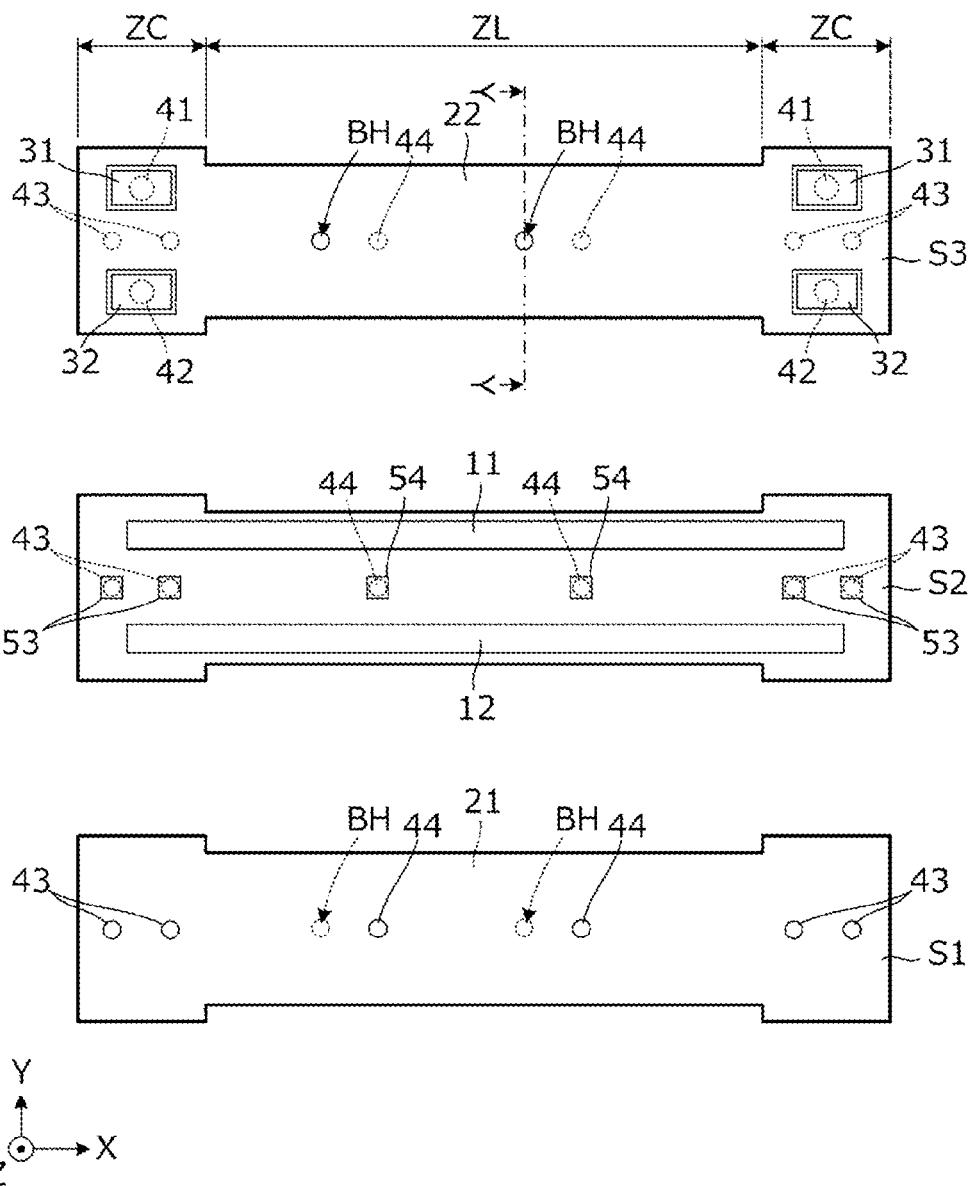
FIG. 8 is an exploded plan view of a transmission line 105 according to a fifth preferred embodiment of the present invention including three base layers of a substrate which is a component of the transmission line.
Figure 9:
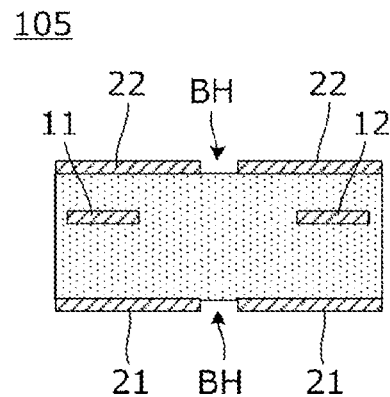
FIG. 9 is a sectional view of the transmission line 105 according to the fifth preferred embodiment of the present invention and is a sectional view taken along line Y-Y in a state where the three base layers illustrated in FIG. 8 are laminated.

FIG. 8 is an exploded plan view of the transmission line 105 according to the fifth preferred embodiment including three base layers of a substrate which is a component of the transmission line. FIG. 9 is a sectional view of the transmission line 105 according to the fifth preferred embodiment and is a sectional view taken along line Y-Y in a state where the three base layers illustrated in FIG. 8 are laminated.

As illustrated in FIG. 8 and FIG. 9, each of the first ground conductor 21 and the second ground conductor 22 includes an opening BH between the fourth interlayer connection conductors 44 adjacent to each other.

According to the present preferred embodiment, since the opening BH is provided, bendability of the transmission line region ZL is improved. Further, when the transmission line 105 is manufactured, gas is generated from a conductor paste for forming the fourth interlayer connection conductor 44, and this gas is likely to be released outside a substrate via the opening BH. That is, the gas does not remain between the base layers or inside the substrate, and thus deformation of the substrate is reduced or prevented.

Sixth Preferred Embodiment

In a sixth preferred embodiment of the present invention, a circuit board including a multipolar connector as an electronic component will be described. Further, a transmission line including three or more signal conductors will be described. Here, the multipolar connector is a connector including multiple lines.

Figure 10:
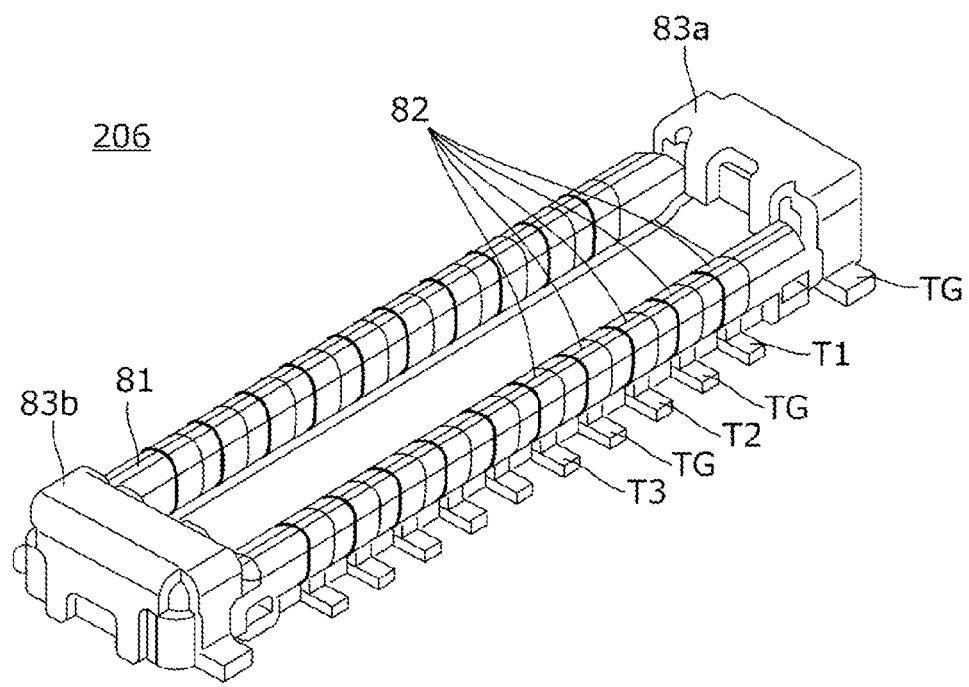
FIG. 10 is a perspective view of an electronic component 206, which is a multipolar connector, included in a circuit board according to a sixth preferred embodiment of the present invention.
Figure 11:
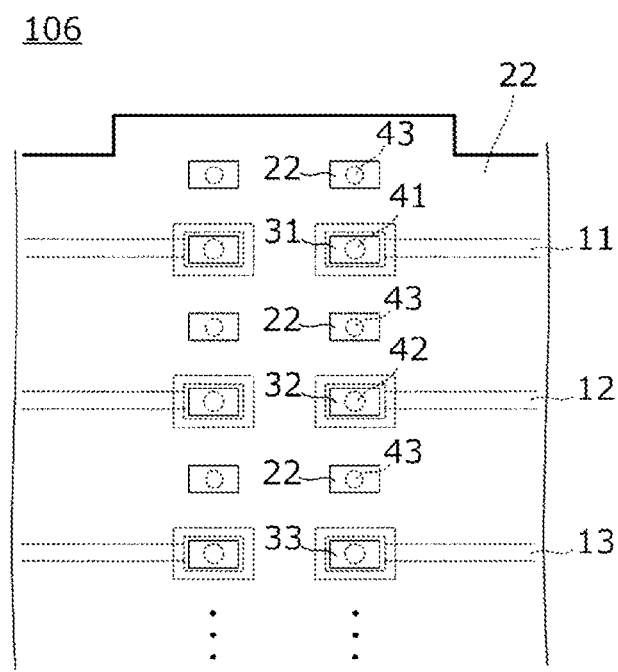
FIG. 11 is a partial plan view of a transmission line 106 to which the electronic component 206 is mounted and illustrates a portion of a mounting portion of the electronic component 206.

FIG. 10 is a perspective view of an electronic component 206, which is a multipolar connector, included in the circuit board of the sixth preferred embodiment. FIG. 11 is a partial plan view of a transmission line 106 on which the electronic component 206 is to be mounted and illustrates a portion of a mounting portion for the electronic component 206.

The electronic component 206 illustrated in FIG. 10 is a multipolar connector in which a large number of contact electrodes 82 and frame electrodes 83a and 83b are integrated with a resin-molded body 81. The electronic component 206 is a male multipolar connector including two rows of projecting portions. The electronic component 206 is mounted to a female multipolar connector including two rows of groove portions.

The electronic component 206 includes signal terminals T1, T2, and T3, which are extracted from the contact electrodes 82 toward a side of a bottom surface, and ground terminals TGs, or the like. The signal terminal T1 corresponds to a "first signal terminal," and the terminal T2 corresponds to a "second terminal."

The transmission line 106 illustrated in FIG. 11 includes a large number of signal conductors such as the first signal conductor 11, the second signal conductor 12, and a third signal conductor 13. In the transmission line 106, the first mounting electrode 31, the second mounting electrode 32, a third mounting electrode 33, a plurality of second ground conductors 22, and the like are exposed in opening portions of a resist film provided on a surface. The third interlayer connection conductor is connected to each exposed portion of the second ground conductor 22.

When the electronic component 206 is mounted on the transmission line 106, the signal terminals T1, T2, and T3 illustrated in FIG. 10 are respectively connected to the mounting electrodes 31, 32, and 33 illustrated in FIG. 11 in a corresponding manner. Further, each of the ground terminals TG is connected to the second ground conductor 22.

According to the present preferred embodiment, the signal terminals adjacent to each other are shielded from each other by the ground conductor 22, the ground terminal TG, and the third interlayer connection conductor present between the signal terminals. Thus, isolation between adjacent transmission lines is ensured. Further, since the third interlayer connection conductor 43 is provided at a position to which the ground terminal TG of the electronic component 206 is connected, a potential difference between the ground terminal TG of the electronic component 206 and the first ground conductor 21 and the second ground conductor 22 can be reduced, and stability as the transmission line is increased.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A transmission line comprising:
   a flexible substrate;
   a first signal conductor and a second signal conductor in the substrate and extending parallel or substantially parallel to each other;
   a first ground conductor and a second ground conductor in or on the substrate and sandwiching the first signal conductor and the second signal conductor in a lamination direction;
   a first mounting electrode and a second mounting electrode on the substrate; and
   a first interlayer connection conductor, a second interlayer connection conductor, a third interlayer connection conductor, and a fourth interlayer connection conductor in the substrate; wherein
   the first interlayer connection conductor connects the first signal conductor and the first mounting electrode;
   the second interlayer connection conductor connects the second signal conductor and the second mounting electrode;
   the third interlayer connection conductor and the fourth interlayer connection conductor respectively include a plurality of third interlayer connection conductors and a plurality of fourth interlayer connection conductors, and each connects the first ground conductor and the second ground conductor between the first signal conductor and the second signal conductor;
   two of the plurality of third interlayer connection conductors are closer to the first interlayer connection conductor and the second interlayer connection conductor than two of the plurality of fourth interlayer connection conductors are;
   an adjacent distance between the two of the plurality of fourth interlayer connection conductors is greater than an adjacent distance between the two of the plurality of third interlayer connection conductors; and
   the adjacent distance between the two of the plurality of third interlayer connection conductors is less than about ½ of a minimum wavelength of a signal transmitted by each of the first signal conductor and the second signal conductor.

2. The transmission line according to claim 1, wherein the adjacent distance between the two of the third interlayer connection conductors is less than about ¼ of the minimum wavelength of the signal.

3. The transmission line according to claim 1, wherein a diameter of the first interlayer connection conductor is larger than a diameter of the third interlayer connection conductor.

4. The transmission line according to claim 1, wherein
   the third interlayer connection conductor is in a mounting region which is a region overlapping an outer shape of an electronic component to be mounted on the substrate via the first mounting electrode and the second mounting electrode; and
   the fourth interlayer connection conductor is a region other than the mounting region.

5. The transmission line according to claim 1, wherein the plurality of third interlayer connection conductors surround the first interlayer connection conductor and the second interlayer connection conductor in a plan view of the substrate.

6. The transmission line according to claim 1, wherein
   the substrate includes a first region with a first thickness and a second region with a second thickness less than the first thickness;
   the first interlayer connection conductor, the second interlayer connection conductor, and the third interlayer connection conductor are in the first region; and
   the fourth interlayer connection conductor is in the second region.

7. The transmission line according to claim 6, wherein a bent portion is provided adjacent to the first region, in the second region.

8. The transmission line according to claim 7, wherein at least one of the first ground conductor and the second ground conductor includes a mesh-shaped portion in the bent portion.

9. The transmission line according to claim 1, wherein at least one of the first ground conductor and the second ground conductor includes an opening between adjacent fourth interlayer connection conductors of the plurality of fourth interlayer connection conductors.

10. A circuit board, comprising:
the transmission line according to claim 1; and
an electronic component; wherein
the electronic component is a multipolar connector including:
  a first signal terminal electrically connected to the first mounting electrode; and
  a second signal terminal electrically connected to the second mounting electrode.

11. The circuit board according to claim 10, wherein
the substrate includes a first region with a first thickness and a second region with a second thickness less than the first thickness;
the first interlayer connection conductor, the second interlayer connection conductor, and the third interlayer connection conductor are in the first region; and
the fourth interlayer connection conductor is in the second region.

12. The circuit board according to claim 11, wherein a bent portion is provided adjacent to the first region, in the second region.

13. The circuit board according to claim 10, wherein the adjacent distance between the two of the third interlayer connection conductors is less than about ¼ of the minimum wavelength of the signal.

14. The circuit board according to claim 10, wherein a diameter of the first interlayer connection conductor is larger than a diameter of the third interlayer connection conductor.

15. The circuit board according to claim 10, wherein
the third interlayer connection conductor is in a mounting region which is a region overlapping an outer shape of an electronic component to be mounted on the substrate via the first mounting electrode and the second mounting electrode; and
the fourth interlayer connection conductor is a region other than the mounting region.

16. The circuit board according to claim 10, wherein the plurality of third interlayer connection conductors surround the first interlayer connection conductor and the second interlayer connection conductor in plan view of the substrate.

17. The circuit board according to claim 10, wherein at least one of the first ground conductor and the second ground conductor includes an opening between adjacent fourth interlayer connection conductors of the plurality of fourth interlayer connection conductors.

18. The circuit board according to claim 10, wherein the adjacent distance between the two of the plurality of fourth interlayer connection conductors is less than about ½ of the minimum wavelength of the signal.

19. The transmission line according to claim 1, wherein the substrate is a laminated body of a plurality of base layers being thermoplastic resin sheets.

20. The transmission line according to claim 1, wherein the adjacent distance between the two of the plurality of fourth interlayer connection conductors is less than about ½ of the minimum wavelength of the signal.

* * * * *